United States Patent [19]

Kamins et al.

[11] 4,163,243

[45] Jul. 31, 1979

[54] ONE-TRANSISTOR MEMORY CELL WITH ENHANCED CAPACITANCE

[75] Inventors: Theodore I. Kamins, Mt. View; Charles G. Sodini, San Francisco, both of Calif.

[73] Assignee: Hewlett-Packard Company, Palo Alto, Calif.

[21] Appl. No.: 838,199

[22] Filed: Sep. 30, 1977

[51] Int. Cl.² .................... H01L 27/04; G11C 11/24
[52] U.S. Cl. ............................... 357/41; 357/24; 357/91; 365/149; 365/178; 365/186
[58] Field of Search .................. 307/238; 357/23, 41; 365/149, 178, 182, 186

[56] References Cited

U.S. PATENT DOCUMENTS

| 3,740,731 | 6/1973 | Ohwada et al. | 307/238 |
| 3,740,732 | 6/1973 | Frandon | 307/238 |
| 4,085,498 | 4/1978 | Rideout | 357/23 |

OTHER PUBLICATIONS

Tasch et al., IEEE Trans. or Electron Devices, vol. Ed 23, No. 2, Feb. 1976, pp. 126–131.
Abbas et al., IBM Tech. Discl. Bulletin, vol. 18, No. 10, Mar. 1976, p. 3288.

Primary Examiner—William D. Larkins
Attorney, Agent, or Firm—Ronald E. Grubman

[57] ABSTRACT

A one-transistor memory cell is provided in which the depletion-layer capacitance of an MOS capacitor is increased by locally enhancing the substrate dopant concentration. In preferred embodiments the substrate may also be doped adjacent to the substrate-insulator boundary with ions of appropriate conductivity type to form a diode junction in the substrate. The effective capacitance of the memory cell is therefore the capacitance of the insulator in parallel with the substantially increased depletion-layer or diode junction capacitance.

3 Claims, 2 Drawing Figures

ONE-TRANSISTOR MEMORY CELL WITH ENHANCED CAPACITANCE

BACKGROUND OF THE INVENTION

The one-transistor memory cell used in most dynamic semiconductor random access memories relies on charge storage on a capacitive element, with the charge gated into the capacitor through the one transistor of the cell. To maximize the density of memory cells on each semiconductor chip, it is desirable to minimize the size of each cell. The cell size is largely determined by the area necessary to store a given amount of charge (the amount being determined by the sensitivity of the associated charge-sensing circuitry) which is inversely proportional to the capacitance per unit area of the cell. Maximization of the per unit area capacitance is therefore desired.

The typical one-transistor memory cell uses an MOS capacitor whose capacitance is composed of the parallel combination of two capacitances: (1) the capacitance between the field plate and the inversion layer (the "oxide capacitance"), and (2) the depletion-layer capacitance between the inversion layer and the substrate. At typical operating voltages, the oxide capacitance is generally much greater than the depletion-layer capacitance, especially when lightly doped substrates are used to reduce capacitance and transistor body effect in other parts of the circuit. The resulting cell size necessary to insure adequate charge storage in prior art devices has been relatively large.

SUMMARY OF THE INVENTION

In accordance with the illustrated preferred embodiments, the present invention provides a memory cell in which the depletion-layer capacitance of the MOS capacitor is increased by locally enhancing the substrate dopant concentration. In preferred embodiments the substrate may also be doped adjacent to the substrate-insulator boundary with ions of opposite conductivity type to form a diode junction in the substrate. The effective capacitance of the memory cell is therefore the capacitance across the insulator in parallel with the depletion-layer or diode junction capacitance.

DETAILED DESCRIPTION OF THE INVENTION

Figure 1:
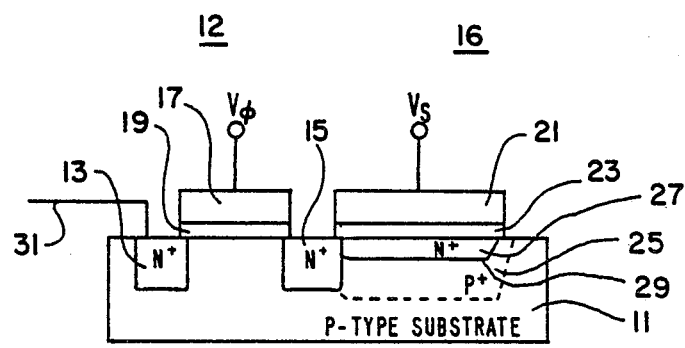
FIG. 1 illustrates a memory cell according to a preferred embodiment of the invention.

In FIG. 1 there is shown a preferred embodiment of the present memory cell including a semiconductor substrate 11, of a semiconductor material such as silicon. For purposes of illustration, substrate 11 will be taken to be a P-tyep silicon substrate which can be obtained e.g. by doping the silicon with boron to a concentration of about $2 \times 10^{15}$ cm$^{-3}$. It will be understood by those skilled in the art that the present device may also be fabricated upon an N-type substrate by substituting suitable dopants for those discussed below.

A lateral switching transistor 12 is formed by doping substrate 11 to form an N+-type source region 13 and an N+-type drain region 15. For example, doping with phosphorus to a concentration of about $10^{19}$ cm$^{-3}$ will suffice. A gate 17 which may be, e.g. of polysilicon or a thin metallic layer overlays an insulating region 19. Insulator 19 is preferably a layer of SiO$_2$ about $0.05\mu$–$0.1\mu$ in thickness. Drain 15 connects switching transistor 12 to a storge-capacitor section 16 of the memory cell. It is also possible to utilize a second level of polysilicon in which case drain 15 may be omitted without changing the basic operation of the cell. Capacitor 16 includes a metallic or polysilicon gate 21 separated from substrate 11 by an insulating layer 23, both similar to gate 17 and insulating layer 19 described above.

In one-transistor memory cells known in the prior art a voltage $V_s$ would be applied to gate 21 to create a depletion-layer at the surface of substrate 11. The voltage was sufficiently high to form an inversion layer, so that charge storage was accomplished at the surface of substrate 11 utilizing the oxide capacitance (between gate 21 and the inversion layer) in parallel with the depletion-layer capacitance between the inversion layer and substrate 11.

In accordance with aspects of the present invention a region 25 extending about $1\mu$ distance into substrate 11 from the insulator-substrate boundary is locally doped to create a P+-type region to decrease the depletion layer width, with a corresponding increase in capacitance per unit area. In some preferred embodiments, a region 27 between region 25 and insulating region 23 (i.e. near the surface of substrate 11) is additionally doped to create an N+-type surface region so that a PN junction 29 is formed at the boundary of regions 25 and 27. Charge will therefore be stored on a capacitor composed of the oxide capacitance in parallel with the capacitance of PN junction 29, as indicated in FIG. 2.

In a preferred embodiment, regions 25 and 27 are formed by ion implantation of boron and arsenic ions respectively. A boron implant dose in the range $1 \times 10^{13}$cm$^{-2}$ to $5 \times 10^{13}$cm$^{-2}$ has produced good results. The arsenic doping forming N+-type region 27 extends to a depth of about $0.5\mu$ in a sufficiently high concentration to effectively serve as an N+-type conducting region. As will be evident to those skilled in the art, other doping techniques such as diffusion may also provide the required doping profiles.

Figure 2:
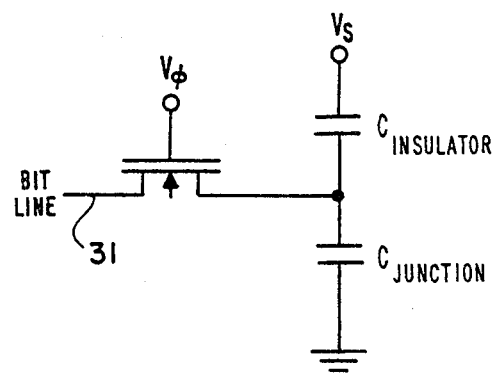
FIG. 2 shows an equivalent circuit of the memory cell of FIG. 1.

In FIG. 2 a logical "1" or "0" is represented by a voltage appearing on bit-line 31. A control voltage $V_\phi$ applied to gate 17 governs the "read" and "write" operations of the cell. When $V_\phi$ is high (about 12 volts for the configuration illustrated in FIG. 1) a channel is created between source 13 and drain 15, allowing charge on bit-line 31 to be transferred to storage capacitor 16. Gate 21 is biased by $V_s$ to a constant voltage with respect to substrate 11, so that the charge representing the logical state will be stored on the parallel combination of the oxide capacitance and the PN junction capacitance (or the parallel combination of the oxide capacitance and depletion-layer capacitance, in the case where N+-type region 27 is omitted).

The memory cell is read by driving $V_\phi$ high, allowing the charge stored on the parallel capacitance to be shared with bit-line 31 through switching transistor 12. The change in bit-line voltage will be proportional to the charge stored, and can be sensed as a logical "1" or a logical "0".

In devices which have been constructed, the doubly implanted structure discussed above has produced a significant reduction in chip area per amount of charge stored, resulting in a concomitant increase in the density of storage cells on each semiconductor chip.

We claim:

1. A semiconductor memory cell comprising:
    a substrate of a semiconductor material of a first conductivity type;
    an insulating layer on a portion of said substrate;
    an electrically conducting gate on said insulating layer having a voltage applied thereto with respect to said substrate to create a depletion layer at the surface of said substrate in which charges can be stored;
    an enhanced region of said first conductivity type but of higher conductivity than said substrate under said electrically conducting gate and extending from said insulating layer into said substrate, said depletion layer and any charges stored therein lying substantially wholly within said enhanced region;
    gating means for introducing charge into said cell to represent a logical state and allowing sensing of charge in said cell to indicate a logical state represented by charge stored in said cell.

2. A memory cell as in claim 1 wherein:
    said gating means comprises an additional pair of surface regions of said second conductivity type in said substrate, an additional insulating layer on a portion of said substrate between said pair of surface regions, and an additional electrically conducting gate on said additional insulating layer.

3. A memory cell as in claim 1 wherein:
    said substrate is a P-type semiconductor; and
    said enhanced region is a P+-type semiconductor.

* * * * *